(12) United States Patent
Pham et al.

(10) Patent No.: US 12,400,939 B2
(45) Date of Patent: Aug. 26, 2025

(54) PACKAGED SEMICONDUCTOR DEVICE INCLUDING HEAT SLUG

(71) Applicant: TEXAS INSTRUMENTS INCORPORATED, Dallas, TX (US)

(72) Inventors: Ken Pham, San Jose, CA (US); Vivek Arora, San Jose, CA (US); Woochan Kim, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 43 days.

(21) Appl. No.: 17/400,913

(22) Filed: Aug. 12, 2021

(65) Prior Publication Data

US 2023/0047555 A1 Feb. 16, 2023

(51) Int. Cl.
*H01L 23/495* (2006.01)
*H01L 21/48* (2006.01)
*H01L 21/56* (2006.01)
*H01L 23/00* (2006.01)
*H01L 23/31* (2006.01)

(52) U.S. Cl.
CPC .... *H01L 23/49513* (2013.01); *H01L 21/4825* (2013.01); *H01L 21/56* (2013.01); *H01L 23/3107* (2013.01); *H01L 23/49524* (2013.01); *H01L 23/49568* (2013.01); *H01L 24/48* (2013.01); *H01L 24/73* (2013.01); *H01L 24/83* (2013.01); *H01L 2224/48175* (2013.01); *H01L 2224/73265* (2013.01); *H01L 2224/83895* (2013.01)

(58) Field of Classification Search
CPC ........... H01L 23/49513; H01L 21/4825; H01L 21/56; H01L 23/3107; H01L 23/49524; H01L 24/48; H01L 24/73; H01L 24/83; H01L 2224/48175; H01L 2224/73265; H01L 2224/83895; H01L 23/49568
USPC ........................................................ 257/676
See application file for complete search history.

(56) References Cited

U.S. PATENT DOCUMENTS

| | | | | |
|---|---|---|---|---|
| 6,703,694 B2* | 3/2004 | Ikenaga | ................... | H01L 24/97 257/676 |
| 6,744,118 B2* | 6/2004 | Ikenaga | .............. | H01L 23/3107 257/667 |
| 9,613,888 B2* | 4/2017 | Yoneyama | ........ | H01L 23/49575 |
| 10,516,239 B2* | 12/2019 | Loetkemann | ........ | H01R 13/516 |
| 10,615,104 B2* | 4/2020 | Rodriguez | .............. | H01L 21/56 |
| 11,676,885 B2* | 6/2023 | Chang | ............... | H01L 23/49548 257/676 |
| 12,136,588 B2* | 11/2024 | Kim | .................... | H01L 23/4334 |

(Continued)

*Primary Examiner* — Jami Valentine Miller
(74) *Attorney, Agent, or Firm* — Ronald O. Neerings; Frank D. Cimino

(57) ABSTRACT

This description relates generally to semiconductor devices and processes. A method for forming a packaged semiconductor package can include attaching a front side of a metal layer to a die pad of a leadframe that includes conductive terminals, so a periphery portion of the metal layer extends beyond a periphery pad surface of the die pad, and a portion of a half-etched cavity on the front side of the metal layer is located near the periphery pad surface of the die pad. The method further includes attaching a semiconductor device to the die pad and encapsulating the semiconductor device, the front side of the metal layer, a portion of a back side of the metal layer, and a portion of the conductive terminals to form a packaged semiconductor device.

34 Claims, 13 Drawing Sheets

(56) References Cited

U.S. PATENT DOCUMENTS

| | | | | |
|---|---|---|---|---|
| 12,278,192 | B2* | 4/2025 | Lin | H01L 24/20 |
| 2002/0084518 | A1* | 7/2002 | Hasebe | H01L 23/3107 |
| | | | | 257/784 |
| 2004/0036151 | A1* | 2/2004 | Hsiao | H01L 23/057 |
| | | | | 257/E23.189 |
| 2005/0260795 | A1* | 11/2005 | Park | H01L 24/48 |
| | | | | 257/E23.037 |
| 2007/0108561 | A1* | 5/2007 | Webster | H10F 39/804 |
| | | | | 257/666 |
| 2014/0302640 | A1* | 10/2014 | Qin | H01L 21/4825 |
| | | | | 438/108 |
| 2016/0293529 | A1* | 10/2016 | Pan | H01L 21/4871 |
| 2018/0331019 | A1* | 11/2018 | Okumura | H01L 24/97 |
| 2019/0043810 | A1* | 2/2019 | Kapusta | H01L 24/19 |
| 2019/0080990 | A1* | 3/2019 | Kimura | H01L 23/49541 |
| 2020/0273838 | A1* | 8/2020 | Williams | H01L 23/3114 |
| 2021/0074612 | A1* | 3/2021 | Miyawaki | H01L 23/13 |
| 2022/0230944 | A1* | 7/2022 | Koduri | H01L 21/56 |
| 2023/0092132 | A1* | 3/2023 | Nguyen | B81C 3/001 |
| | | | | 257/458 |

\* cited by examiner

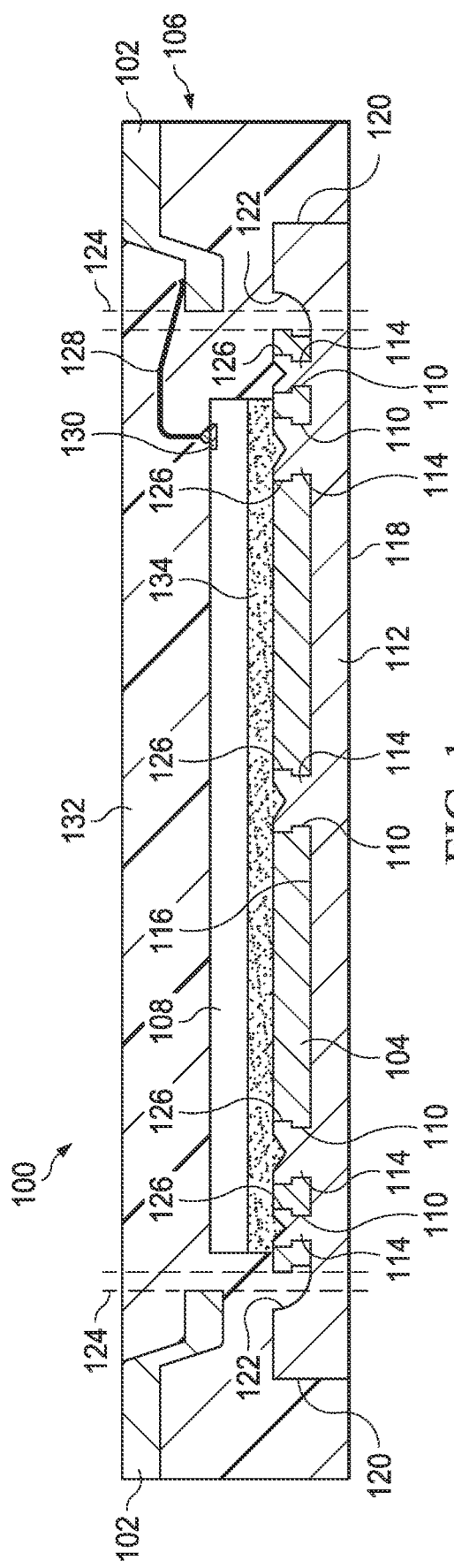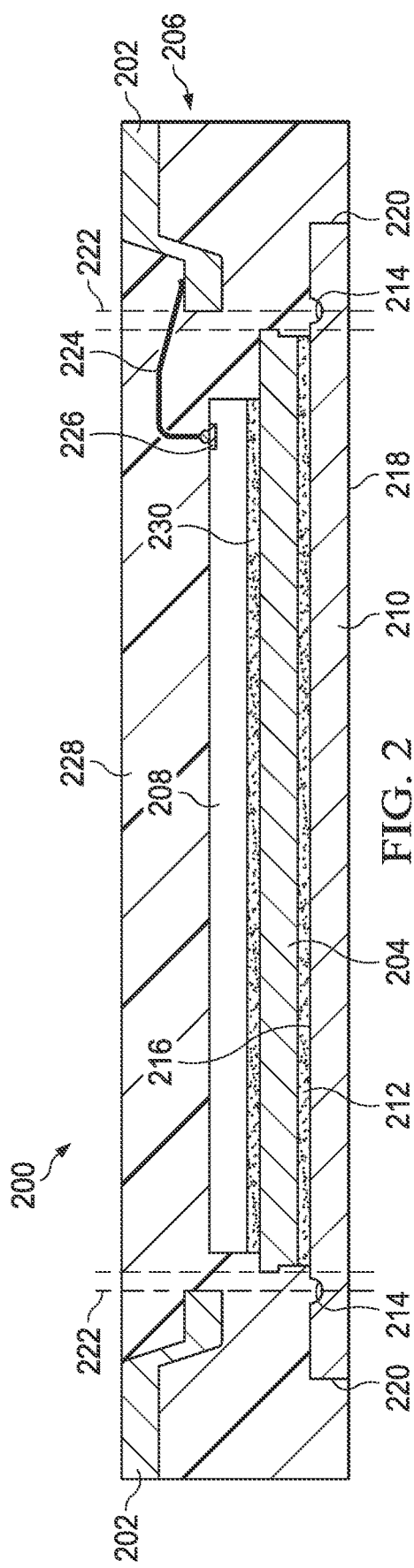

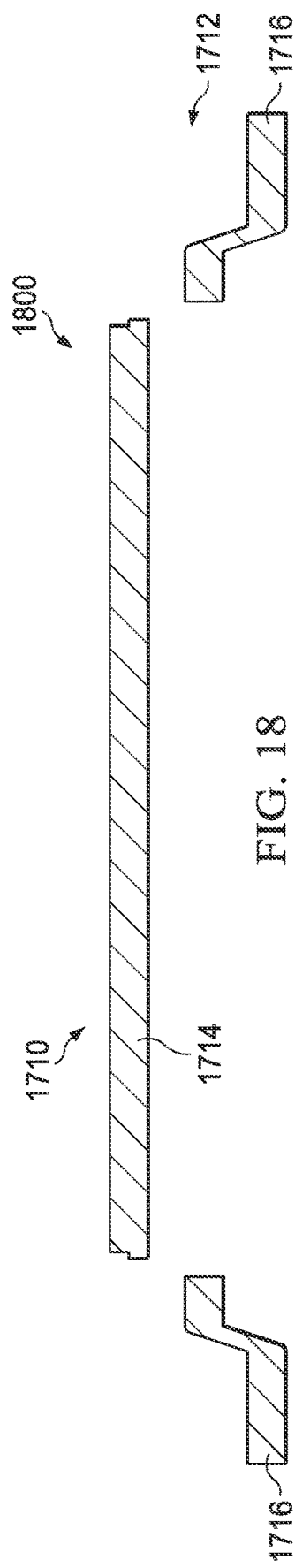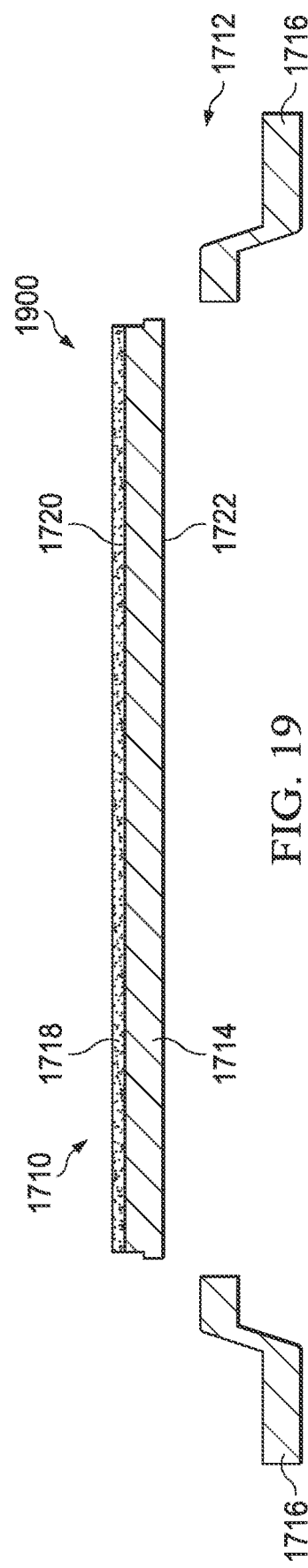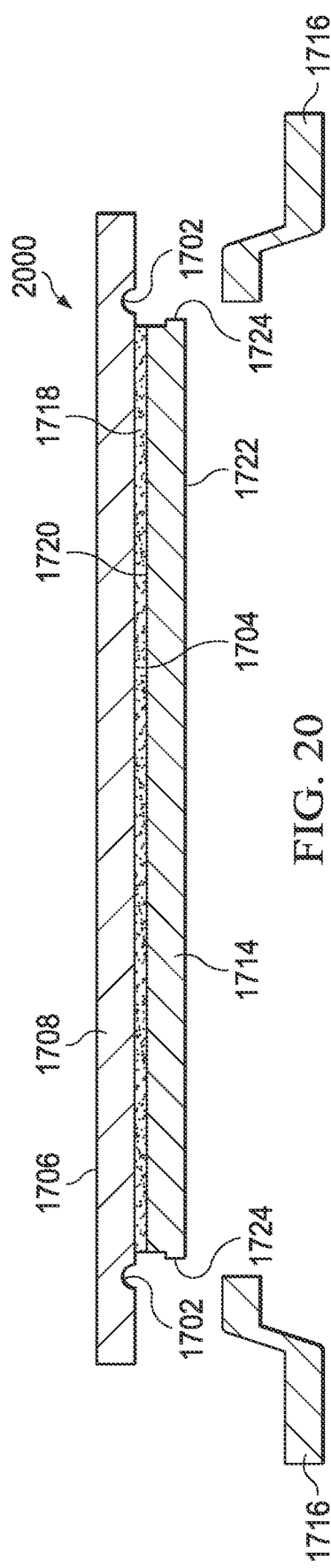

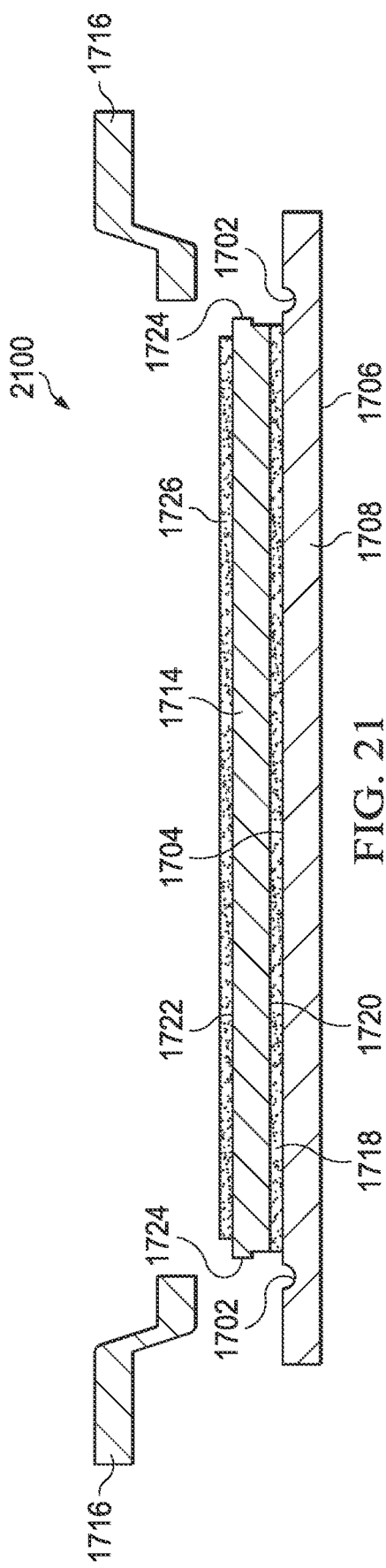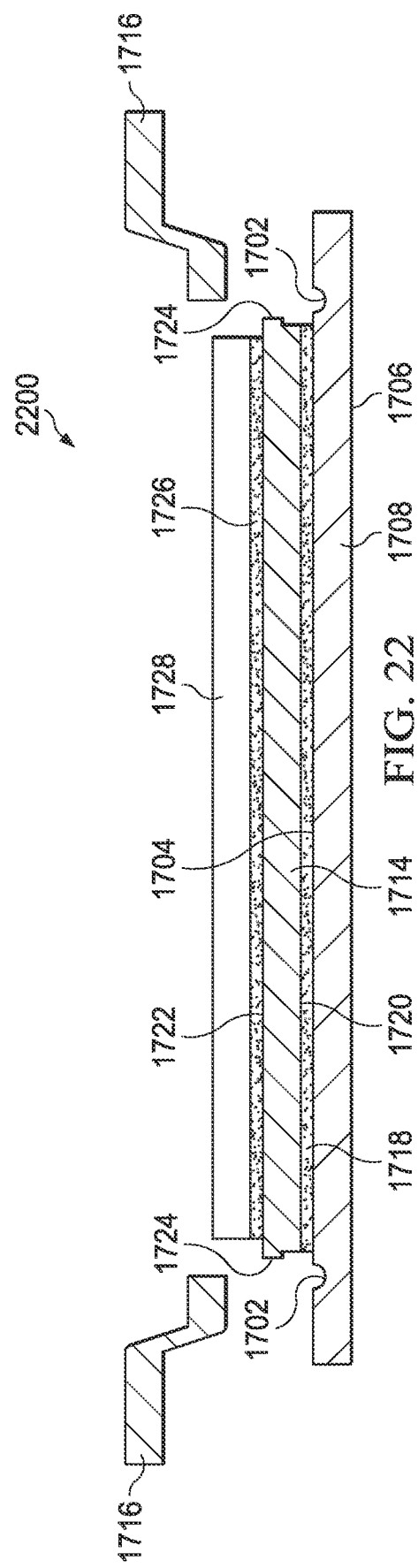

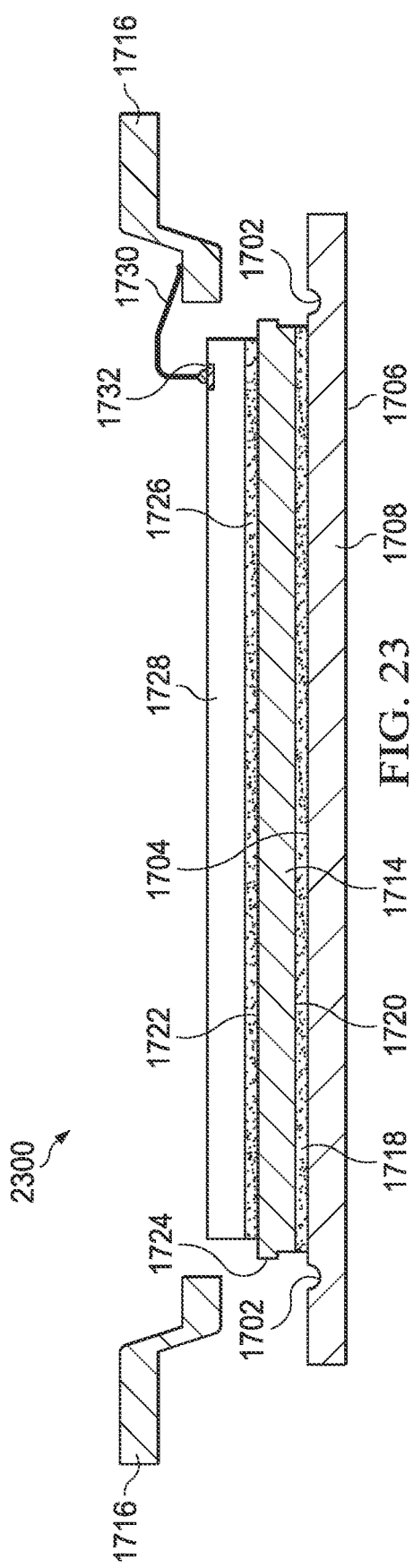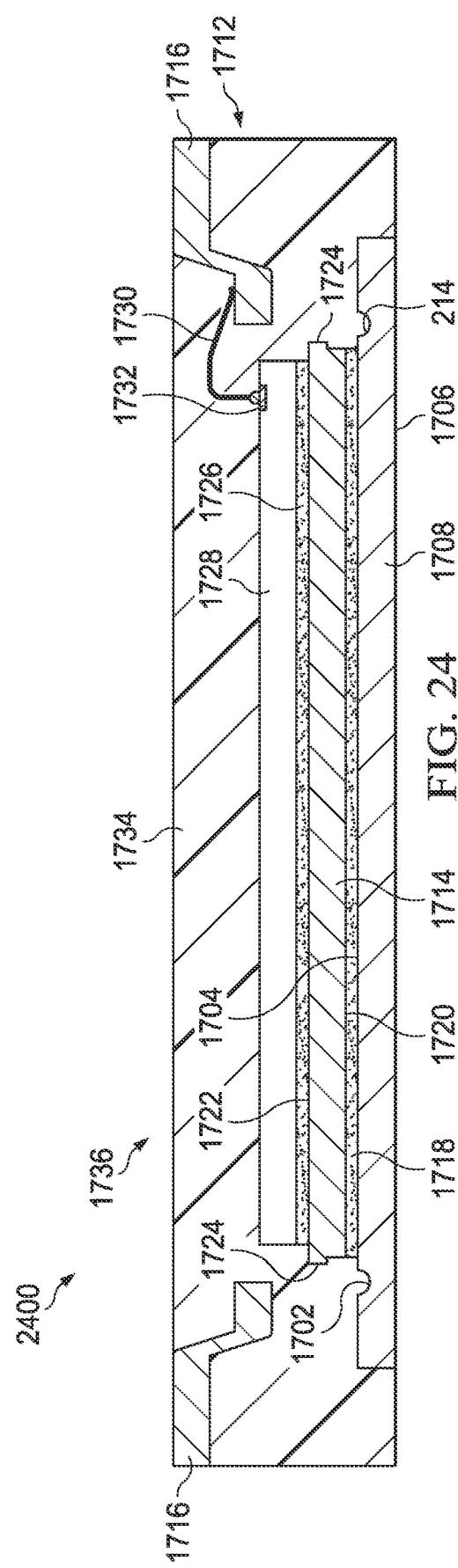

PACKAGED SEMICONDUCTOR DEVICE INCLUDING HEAT SLUG

TECHNICAL FIELD

This description relates generally to semiconductor devices and processes, and more specifically, to methods of forming a semiconductor package.

BACKGROUND

A semiconductor package is a metal, plastic, glass, or ceramic casing containing one or more discrete semiconductor devices or ICs and a leadframe. Leadframes are metal structures inside a semiconductor package that carry signals from a semiconductor device to an outside (e.g., external circuitry, such as to a printed circuit board (PCB). A leadframe is composed of a central thermal die pad, where the semiconductor device is to be placed, and leads, which are metal structures for connecting the semiconductor device with the outside. The semiconductor device inside the semiconductor package can be attached to the central die pad by conductive (e.g. silver or solder paste) or non-conductive materials.

SUMMARY

In an example, a method can include attaching a front side of a metal layer to a die pad of a leadframe that includes conductive terminals, so a periphery portion of the metal layer extends beyond a periphery pad surface of the die pad, and a portion of a half-etched cavity on the front side of the metal layer is located near the periphery pad surface of the die pad. The method further includes attaching a semiconductor device to the die pad and encapsulating the semiconductor device, the front side of the metal layer, a portion of a back side of the metal layer, and a portion of the conductive terminals to form a packaged semiconductor device.

In a further example, a method can include etching grooves on a front side of a metal layer opposite of a back side of the metal layer, and attaching the front side of the metal layer to a die pad of a leadframe comprising conductive terminals, so a periphery portion of the metal layer extends beyond a periphery pad surface of the die pad, and the etched grooves are located near the periphery of the die pad. The method further includes attaching a semiconductor device to the die pad, and encapsulating the semiconductor device, the front side of the metal layer, a portion of the back side of the metal layer, and a portion of the conductive terminals to form a packaged semiconductor device.

In another example, a semiconductor device can include a leadframe comprising a die pad. The die pad can include through holes extending through the die pad. The semiconductor device can further include a chip attached to the die pad, and a metal layer comprising grooves on a side of the metal layer, wherein a periphery portion of the metal layer extends beyond a periphery pad surface of the die pad, and the grooves are located near the periphery of the die pad. The semiconductor device includes a layer of a bonding material between the metal layer and the die pad.

In another example, a semiconductor device can include a leadframe that can include a die pad. The die pad can include through holes extending through the die pad. The semiconductor device can include a chip attached to the die pad and a metal layer comprising protruding posts on a front side of the metal layer opposite of a back side of the metal layer, in which the protruding posts extend into respective through holes of the die pad, and a periphery portion of the metal layer extends beyond a periphery pad surface of the die pad.

BRIEF DESCRIPTION OF THE DRAWINGS

FIG. 1 is an example of a cross-sectional view of a semiconductor device.

FIG. 2 is an example of a cross-sectional view of another semiconductor device.

FIG. 18 is an example of a second stage of another process flow for fabricating a leadframe assembly of the semiconductor device.

FIG. 19 is an example of a third stage of another process flow for fabricating the semiconductor device that includes applying an adhesive material for attaching the metal layer to the leadframe assembly.

FIG. 20 is an example of a fourth stage of another process flow for fabricating the semiconductor device that includes attaching the metal layer to the leadframe assembly.

FIG. 21 is an example of a fifth stage of another process flow for fabricating the semiconductor device that includes applying an adhesive material for attaching a chip.

FIG. 22 is an example of a sixth stage of another process flow for fabricating the semiconductor device that includes attaching the chip to the leadframe assembly.

FIG. 23 is an example of a sixth stage of a process flow for fabricating the semiconductor device that includes attaching at least one wire to a chip bonding pad of the chip and a respective conductive terminal of conductive terminals of the leadframe assembly.

FIG. 24 is an example of a seventh stage of another process flow for fabricating the semiconductor device that includes applying a molding compound.

DETAILED DESCRIPTION

Figure 3:
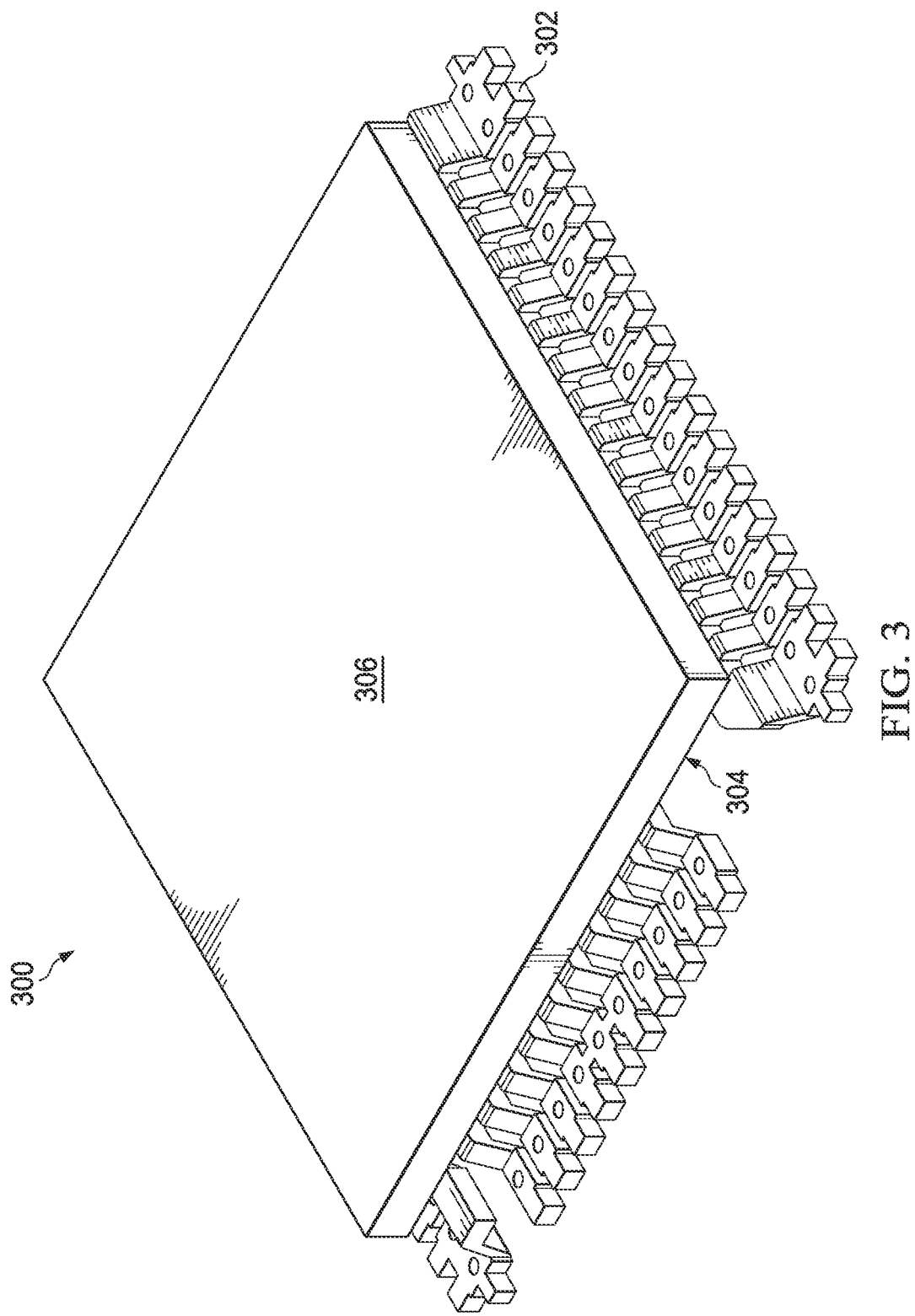
FIG. 3 is an example of a leadframe assembly with a heat slug for a semiconductor device.

This description relates generally to semiconductor devices and processes. High power ICs in quad flat non-leaded (QFN) packages are becoming smaller and heat generated by one or more chips packaged therein needs to be adequately dissipated to avoid impact on chip performance. One approach for dissipating the heat generated by the one or more chips within the QFN package is to use thicker leadframes in contrast to leadframes that are used in standard QFN packages. However, the use of thicker leadframes increases a size of the QFN package, which increases an overall unit cost of the QFN package. Alternatively, a different package can be used, such as a transistor outline (TO) package, however, these packages do not have sufficient pins for power circuitry (e.g., power stage circuitry) in contrast to a QFN package.

In some examples, a semiconductor device can be provided with a heat slug. During fabrication of the semiconductor device, the heat slug can be attached to a patterned formed leadframe, which can be packaged with a chip to provide a packaged semiconductor device. For example, the heat slug can be attached to a front side of a formed central thermal die pad of the patterned formed leadframe opposite of a back side to which at least one chip is attached to increase a heat dissipation area for the at least one chip attached to the formed central thermal die pad. In some examples, the patterned formed leadframe can have a single gauge leadframe (e.g., in which the formed central thermal die pad and conductive leads of the patterned formed leadframe have about a same thickness). The term "heat slug" as used herein can refer to a metal layer that has a greater surface area than a formed central thermal die pad of a patterned formed leadframe to which the heat slug is to be attached.

By attaching the heat slug to the patterned formed leadframe a heat dissipation area for the chip can be increased, thereby improving a thermal performance of the semiconductor device. The heat slug can be attached to the formed central thermal die pad to provide an increased area for spreading heat produced by one or more chips therein. The examples herein illustrate heat slugs attached to patterned formed leadframes and packaged in QFN packages. In other examples, a different package can be used, for example, other types of no-lead packages, such as Small Outline No-Lead (SON) can be used for packaging leadframes.

FIG. 1 is an example of a cross-sectional view of a semiconductor device 100. The semiconductor device 100 can be a packaged QFN-type semiconductor device. The semiconductor device 100 can include conductive terminals 102 and a formed central thermal die pad 104. The conductive terminals 102 and the formed central thermal die pad 104 can form a leadframe 106 for a chip 108 of the semiconductor device 100. As an example, the chip 108 can be a driver IC, such as a Gallium Nitride (GaN) gate driver. In other examples, the chip 108 may be a different type of chip. The formed central thermal die pad 104 can include through holes 110. The through holes 110 can extend through the formed central thermal die pad 104.

In some examples, the semiconductor device 100 includes a heat slug 112. The heat slug 112 can have a greater surface area and in some examples a greater thickness than the formed central thermal die pad 104, as shown in FIG. 1. In some examples, the heat slug 112 has a similar thickness as the leadframe 106. In examples, wherein the heat slug 112 and the leadframe 106 have a similar thickness, the semiconductor device 100 can be QFN packaged while retaining a similar thickness package thickness as a standard QFN package. As an example, the standard QFN package can have a thickness of about 1 millimeter (mm) to about 5 mm. The heat slug 112 can include protruding posts 114 on a first side 116 of the heat slug 112 opposite of a second side 118 of the heat slug 112. The protruding posts 114 can extend into respective through holes 110 of the formed central thermal die pad 104. A periphery portion 120 of the heat slug 112 can extend beyond a periphery pad surface of the formed central thermal die pad 104. The heat slug 112 further includes a half etched-cavity 122 on the first side 116 of the heat slug 112 and a portion of the half-etched cavity 122 can be located near a periphery of the formed central thermal die pad 104. In some examples, a gap 124 can separate at least some of the conductive terminals 102 from the formed central thermal die pad 104.

In some examples, a riveting process can be used to secure the heat slug 112 to the formed central thermal die pad 104. For example, during the riveting process, each of the protruding posts 114 can be inserted through a respective through hole of the through holes 110, such that a respective tail end 126 of each protruding post extends through the respective through hole. In other examples, a laser welding process can be used to secure the heat slug 112 to the formed central thermal die pad 104. For example, during the laser welding process, each of the protruding posts 114 can be inserted through the respective through hole of the through holes 110, such that the respective tail end 126 of each protruding post extends through the respective through hole. In either of the riving or laser welding processes, the tail ends 126 of the respective protruding posts 114 can be deformed to secure the heat slug 112 to the formed central thermal die pad 104.

In some examples, the semiconductor device 100 includes at least one wire 128. As an example, the at least one wire 128 can be a copper wire. The at least one wire 128 can span the gap 124 between a chip bonding pad 130 of the chip 108 and a respective conductive terminal of the conductive terminals 102. For clarity and brevity purposes, the example of FIG. 1 shows a single wire spanning the gap 124, however, it is be understood that any number of wires may span the gap 124 between a respective chip bonding pad of the chip 108 and the respective conductive terminal of the conductive terminals 102. In some examples, the semiconductor device 100 includes a packaging material 132. The packaging material 132 can be a molding compound and can encapsulate the chip 108, the first side 116 of the heat slug 112, a portion of the conductive terminals 102, and a portion of the second side 118 of the heat slug 112 to provide a packaged semiconductor device. In some examples, the chip 108 can be attached via a bonding material 134 to a surface of the formed central thermal die pad 104 opposite to a surface to which the heat slug 112 is attached.

Because the heat slug 112 has a greater surface area than the formed central thermal die pad 104, attaching the heat slug 112 to the formed central thermal die pad 104 increases a heat spreading area for spreading heat produced by the chip 108. The heat produced by the chip 108 can be provided conductively to the formed central thermal die pad 104, which can provide the heat to the heat slug 112 for dissipation into an environment or atmosphere. Accordingly, the packaged QFN-type semiconductor device 100 can have a lower thermal resistance in contrast to existing packaged QFN-type semiconductor devices.

FIG. 2 is an example of a cross-sectional view of another semiconductor device 200. The semiconductor device 200 can be a packaged QFN-type semiconductor device. The semiconductor device 200 can include conductive terminals 202 and a formed central thermal die pad 204. The conductive terminals 202 and the formed central thermal die pad 204 can form a leadframe 206 for a chip 208 of the semiconductor device 200. As an example, the chip 208 can be a driver IC, such as a GaN gate driver. In other examples, the chip 208 may be a different type of chip.

In some examples, the semiconductor device 200 includes a heat slug 210. The heat slug 210 can have a greater surface area and in some examples a greater thickness than the formed central thermal die pad 204, as shown in FIG. 2. In some examples, the heat slug 210 has a similar thickness as the leadframe 206. In examples wherein the heat slug 210 and the leadframe 206 have a similar thickness, the semiconductor device 200 can be QFN packaged while retaining a similar thickness package thickness as a standard QFN package. In some examples, the heat slug 210 can be attached via a bonding material 212 to a first surface of the formed central thermal die pad 204 opposite a second surface. The heat slug 210 can include openings 214 on a first side 216 opposite of a second side 218 of the heat slug 210. In some examples, the openings 214 are grooves, such as half-etched grooves.

The openings 214 can be used during fabrication or assembly of the semiconductor device 200 for guidance (e.g., placement) of the chip 208 on the first surface of the formed central thermal die pad 204. The openings 214 can be located near a periphery portion 220 of the heat slug 210. As shown in FIG. 2, the periphery portion 220 of the heat slug 210 can extend beyond a periphery pad surface of the formed central thermal die pad 204. In some examples, a gap 222 can separate at least some of the conductive terminals 202 from the formed central thermal die pad 204. The openings 214 can be at least partially located within the gap 222, and thus at about the periphery portion 220 of the heat slug 210.

In some examples, the semiconductor device 200 includes at least one wire 224. As an example, the at least one wire 224 can be a copper wire. The at least one wire 224 can span the gap 222 between a chip bonding pad 226 of the chip 208 and a respective conductive terminal of the conductive terminals 202. For clarity and brevity purposes, the example of FIG. 2 shows a single wire spanning the gap 222, however, it is be understood that any number of wires may span the gap 222 between a respective chip bonding pad of the chip 208 and the respective conductive terminal of the conductive terminals 202. In some examples, the semiconductor device 200 includes a packaging material 228. The packaging material 228 can be a molding compound and can encapsulate the chip 208, the first side 216 of the heat slug 210, a portion of the conductive terminals 202, and a portion of the second side 218 of the heat slug 210 to provide a packaged semiconductor device. In some examples, the chip 208 can be attached via a bonding material 230 to the second surface of the formed central thermal die pad 204 opposite the first surface to which the heat slug 210 is attached.

Because the heat slug 210 has a greater surface area than the formed central thermal die pad 204, attaching the heat slug 210 to the formed central thermal die pad 204 increases a heat spreading area for spreading heat produced by the chip 208. The heat produced by the chip 208 can be provided conductively to the formed central thermal die pad 204, which can provide the heat to the heat slug 210 for dissipation into an environment or atmosphere. Accordingly, the packaged QFN-type semiconductor device 200 can have a lower thermal resistance in contrast to existing packaged QFN-type semiconductor devices.

FIG. 3 is an example of leadframe assembly 300 of a semiconductor device, such as the semiconductor device 100, as shown in FIG. 1, or the semiconductor device 200, as shown in FIG. 2. Thus, reference can be made to the example of FIGS. 1-2 in the example of FIG. 3. The leadframe assembly 300 can include conductive terminals 302, a formed central thermal die pad 304. As shown in FIG. 3, a heat slug 306 (e.g., the heat slug 112, as shown in FIG. 1, or the heat slug 210, as shown in FIG. 2) can be coupled to the leadframe assembly 300. In the example of FIG. 3, the heat slug 306 is attached to a surface of the formed central thermal die pad 304 opposite a surface to which a chip (e.g., the chip 108, as shown in FIG. 1, or the chip 208, as shown in FIG. 1) can be attached.

Figure 4:
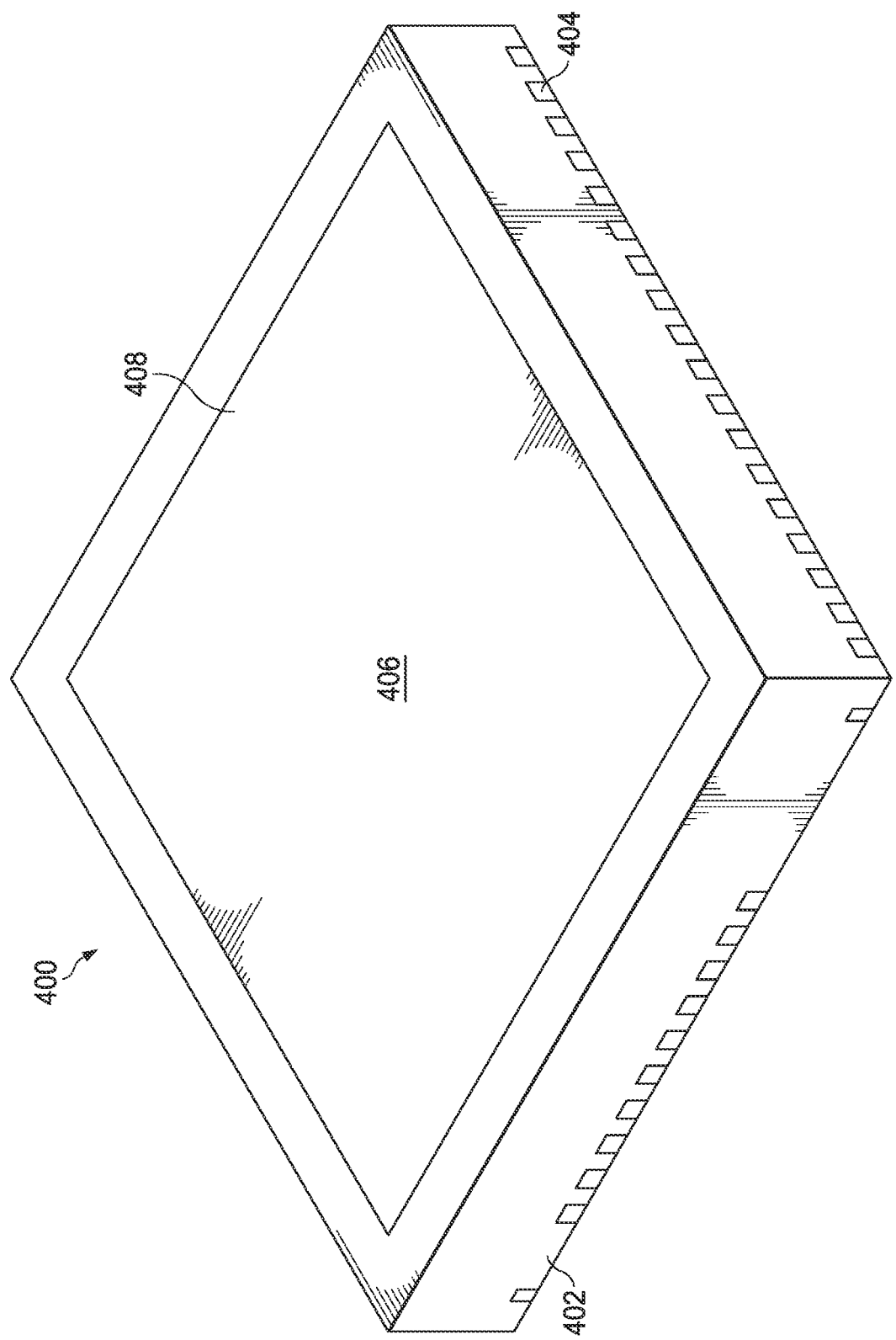
FIG. 4 is an example of a molded package with a heat slug.

FIG. 4 is an example of a molded package 400. The molded package 400 can include semiconductor device 100, as shown in FIG. 1, or the semiconductor device 200, as shown in FIG. 2. In some examples, the molded package 400 includes the leadframe assembly 300, as shown in FIG. 3. Thus, reference can be made to the example of FIGS. 1-3 in the example of FIG. 4. As shown in FIG. 4, the molded package 400 includes a packaging material 402 (e.g., the packaging material 132, as shown in FIG. 1, or the packaging material 228, as shown in FIG. 2), conductive leads 404 (e.g., the conductive terminals 102, as shown in FIG. 1, or the conductive terminals 202, as shown in FIG. 2), and a heat slug 406 (e.g., the heat slug 112, as shown in FIG. 1, or the heat slug 210, as shown in FIG. 2). The packaging material 402 can encapsulate a portion of the conductive leads 404 of the molded package 400, and a portion of a second side 408 of the heat slug 406 of the molded package 400. The second side 408 of the heat slug 406 can correspond to the second side 118, as shown in FIG. 1, or the second side 218, as shown in FIG. 2.

Figure 5:
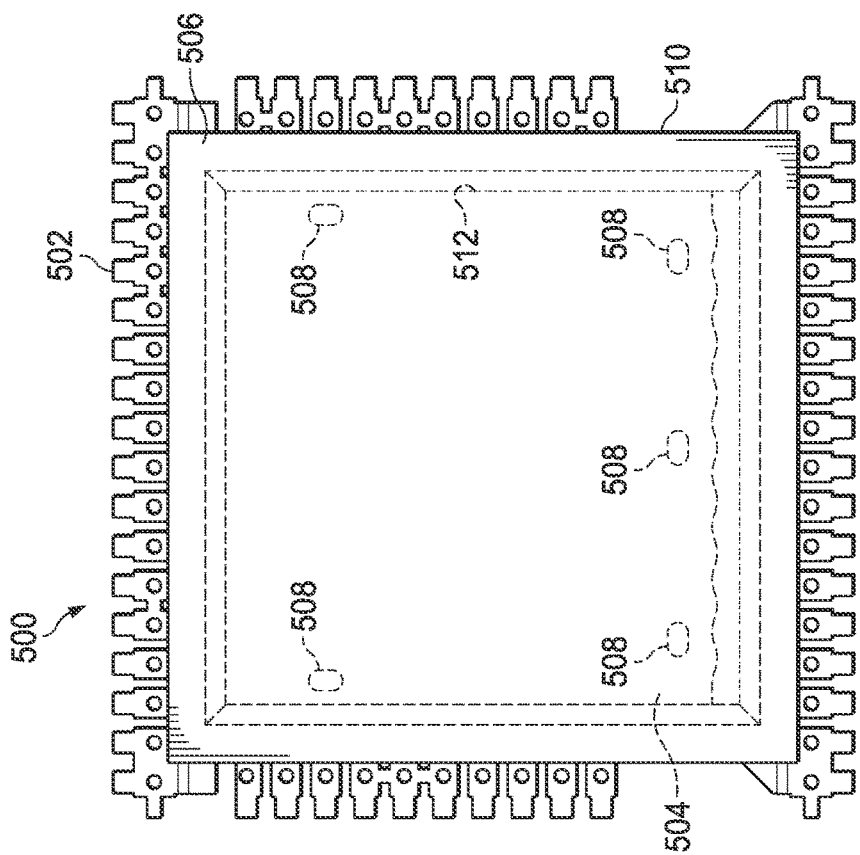
FIG. 5 is an example of a top view of a leadframe assembly for a semiconductor device.

FIG. 5 is an example of a top view of a leadframe assembly 500 for a semiconductor device, such as the semiconductor device 100, as shown in FIG. 1, or the packaged semiconductor device 400, as shown in FIG. 4. In some examples, the leadframe assembly 500 can be the leadframe assembly 300, as shown in FIG. 3. Thus, reference can be made to the example of FIGS. 1 and 3-4 in the example of FIG. 5. The leadframe assembly 500 can include conductive terminals 502 extending around a perimeter of the leadframe assembly 500, a formed central thermal die pad 504, and a heat slug 506 (e.g., the heat slug 112, as shown in FIG. 1, or the heat slug 210, as shown in FIG. 2).

In the example of FIG. 5, the heat slug 506 is attached to a surface of the formed central thermal die pad 504 opposite a surface to which a chip (e.g., the chip 108, as shown in FIG. 1, or the chip 208, as shown in FIG. 1) can be attached. For example, protruding posts (e.g., the protruding posts 114, as shown in FIG. 1) of the heat slug 506 can be positioned through a respective through hole of through holes 508, such that a distal end of each protruding post extends through the respective through hole. The heat slug 506 can be attached to the formed central thermal die pad 504, such that a periphery portion 510 of the heat slug 506 extends beyond a periphery pad surface 512 of the formed central thermal die pad 504. In some examples, the periphery portion 510 as shown in FIG. 5 can correspond to the periphery portion 120, as shown in FIG. 1.

Figure 6:
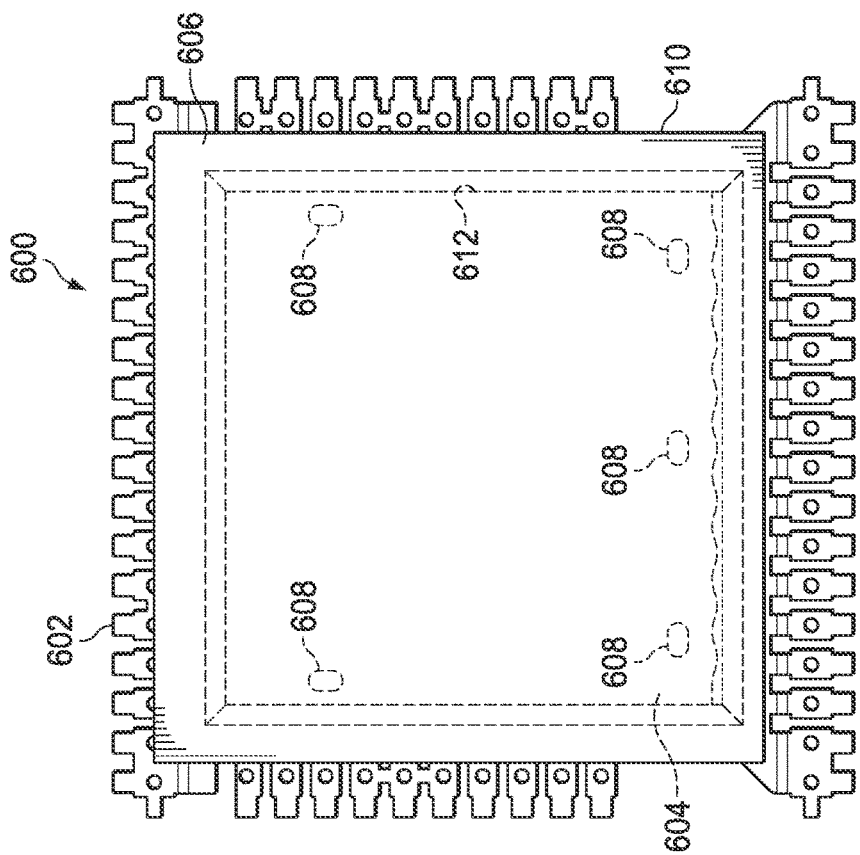
FIG. 6 is an example of a top view of another leadframe assembly for a semiconductor device.

FIG. 6 is an example of a top view of another leadframe assembly 600 for a semiconductor device, such as the semiconductor device 100, as shown in FIG. 1, or the packaged semiconductor device 400, as shown in FIG. 4. In some examples, the leadframe assembly 600 can be the leadframe assembly 300, as shown in FIG. 3. Thus, reference can be made to the example of FIGS. 1 and 3-4 in the example of FIG. 5. The leadframe assembly 600 can include conductive terminals 602 extending around a perimeter of the leadframe assembly 600, a formed central thermal die pad 604, and a heat slug 606 (e.g., the heat slug 112, as shown in FIG. 1, or the heat slug 210, as shown in FIG. 2).

In the example of FIG. 6, the heat slug 606 is attached to a surface of the formed central thermal die pad 604 opposite a surface to which a chip (e.g., the chip 108, as shown in FIG. 1, or the chip 208, as shown in FIG. 1) can be attached. For example, protruding posts (e.g., the protruding posts 114, as shown in FIG. 24) of the heat slug 606 can be positioned through a respective through hole of through holes 608, such that a distal end of each protruding post extends through the respective through hole. As shown in FIG. 6, a periphery portion 610 of the heat slug 606 can extend beyond a periphery pad surface 612 of the formed central thermal die pad 604. In some examples, the periphery portion 610 as shown in FIG. 6 can correspond to the periphery portion 120, as shown in FIG. 1. The heat slug 606 can be formed with protruding posts that once positioned through the respective through hole of the through holes 608 offsets the heat slug 606 relative to the formed central thermal die pad 604. The heat slug 606 can be offset relative to the formed central thermal die pad 604 to provide sufficient creepage clearance between the heat slug 606 and at least some of the conductive terminals 602.

Figure 7:
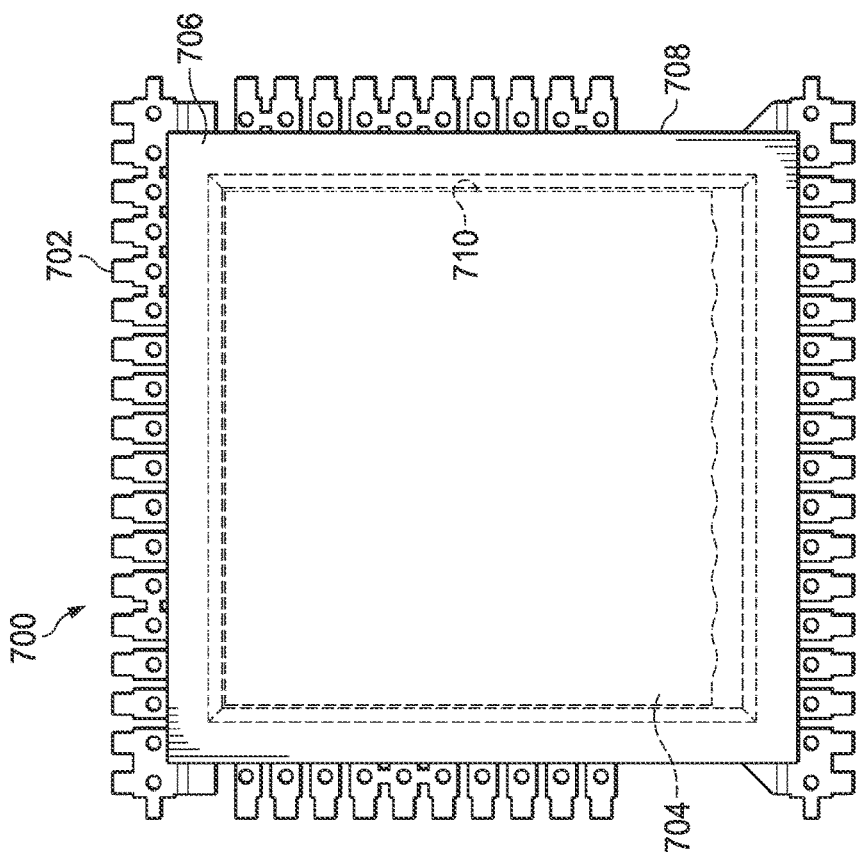
FIG. 7 is an example of a top view of a further leadframe assembly for a semiconductor device.

FIG. 7 is an example of a top view of a leadframe assembly 700 for a semiconductor device, such as the semiconductor device 200, as shown in FIG. 2, or the packaged semiconductor device 400, as shown in FIG. 4. In some examples, the leadframe assembly 500 can be leadframe assembly 300, as shown in FIG. 3. Thus, reference can be made to the example of FIGS. 2-4 in the example of FIG. 7. The leadframe assembly 700 can include conductive terminals 702 extending around a perimeter of the leadframe assembly 700, a formed central thermal die pad 704, and a heat slug 706 (e.g., the heat slug 112, as shown in FIG. 1, or the heat slug 210, as shown in FIG. 2).

In the example of FIG. 7, the heat slug 706 is attached to a surface of the formed central thermal die pad 704 opposite a surface to which a chip (e.g., the chip 108, as shown in FIG. 1, or the chip 208, as shown in FIG. 1) can be attached. For example, the heat slug 706 can be attached via a bonding material (e.g., the bonding material 212, as shown in FIG. 2) to a first surface of the formed central thermal die pad 704 opposite a second surface to which the chip can be attached. The heat slug 706 can be attached to the formed central thermal die pad 704, such that a periphery portion 708 of the heat slug 706 extends beyond a periphery pad surface 710 of the formed central thermal die pad 704. In some examples, the periphery portion 708 of FIG. 7 can correspond to the periphery portion 220, as shown in FIG. 2.

Figure 8:
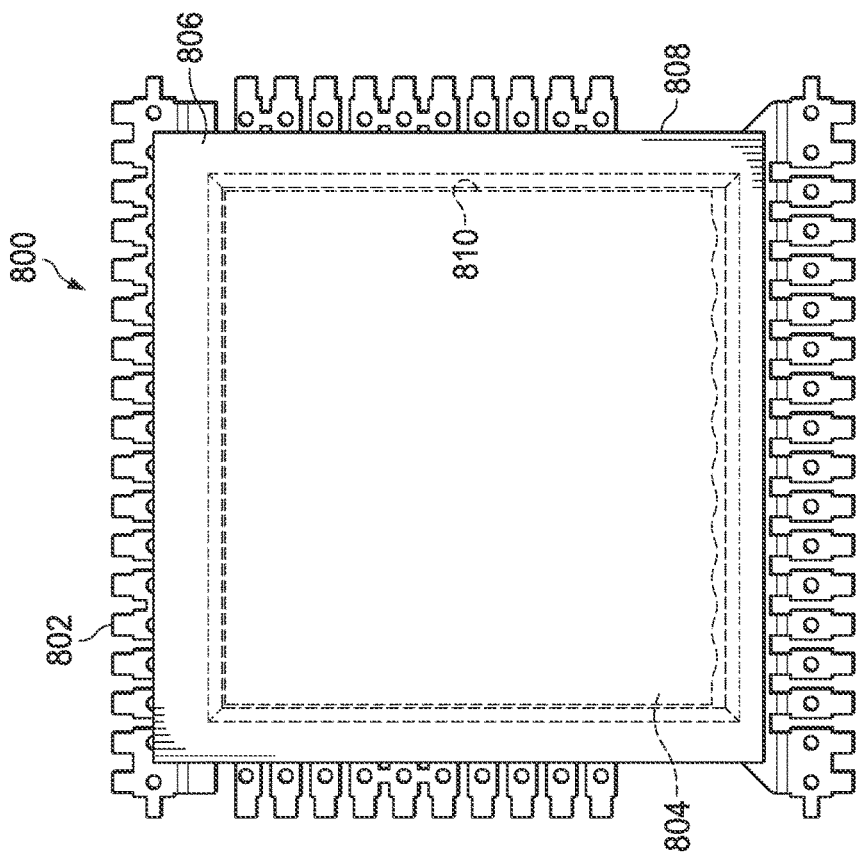
FIG. 8 is an example of a top view of a yet another leadframe assembly for a semiconductor device.

FIG. 8 is an example of a top view of a leadframe assembly 800 for a semiconductor device, such as the semiconductor device 200, as shown in FIG. 2, or the packaged semiconductor device 400, as shown in FIG. 4. In some examples, the leadframe assembly 800 can be the leadframe assembly 300, as shown in FIG. 3. Thus, reference can be made to the example of FIGS. 2-4 in the example of FIG. 8. The leadframe assembly 800 can include conductive terminals 802 extending around a perimeter of the leadframe assembly 800, a central thermal die pad 804, and a heat slug 806 (e.g., the heat slug 112, as shown in FIG. 1, or the heat slug 210, as shown in FIG. 2).

In the example of FIG. 8, the heat slug 806 is attached to a surface of the formed central thermal die pad 804 opposite a surface to which a chip (e.g., the chip 108, as shown in FIG. 1, or the chip 208, as shown in FIG. 1) can be attached. For example, the heat slug 806 can be attached via a bonding material (e.g., the bonding material 212, as shown in FIG. 2) to a first surface of the formed central thermal die pad 804 opposite a second surface to which the chip can be attached. The heat slug 806 can be attached to the formed central thermal die pad 804, such that a periphery portion 808 of the heat slug 806 extends beyond a periphery pad surface 810 of the formed central thermal die pad 704. The heat slug 606 can be attached to the formed central thermal die pad 804, such that the heat slug 806 is offset relative to the formed central thermal die pad 804. The heat slug 806 can be offset relative to the formed central thermal die pad 804 to provide sufficient creepage clearance between the heat slug 806 and at least some of the conductive terminals 802.

Figure 9:
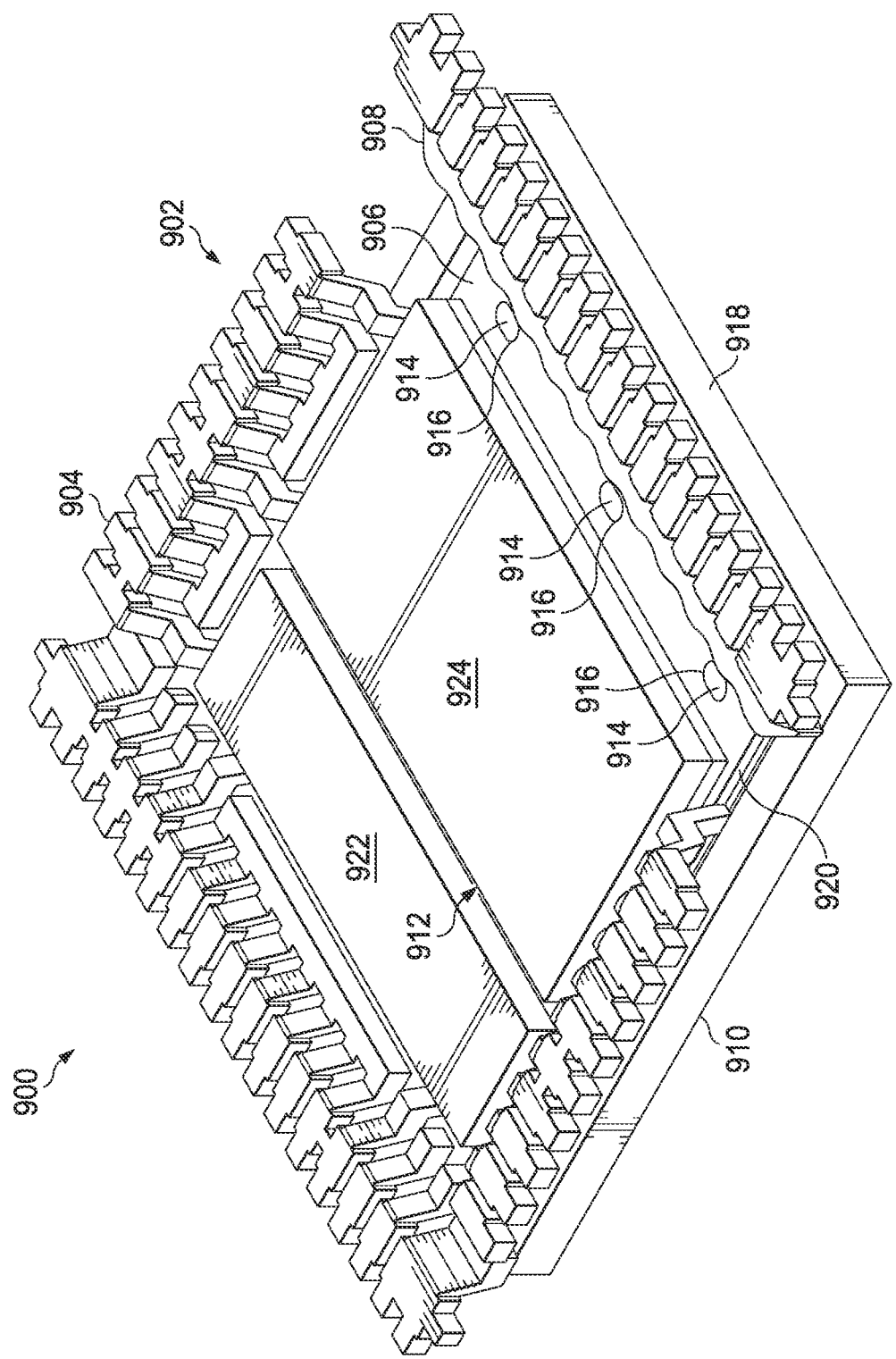
FIG. 9 is an example of a partial view of a semiconductor device.

FIG. 9 is an example of a semiconductor device 900 prior to being encapsulated with a packaging material to provide a packaged semiconductor device, such as the semiconductor device 100, as shown in FIG. 1, or the packaged semiconductor device 400, as shown in FIG. 4. The semiconductor device 900 can include a leadframe assembly 902. The leadframe assembly 902 can be similar to the leadframe assembly 300, as shown in FIG. 3, or the leadframe assembly 500, as shown in FIG. 5. Thus, reference can be made to the example of FIGS. 1 and 4-5 in the example of FIG. 9. The leadframe assembly 902 can include conductive terminals 904, a formed central thermal die pad 906, and a heat slug 908.

The heat slug 908 is attached to a surface of the formed central thermal die pad 906 opposite a surface 910 to which a chip 912 (e.g., the chip 108, as shown in FIG. 1) is attached. For example, protruding posts 914 of the heat slug 908 can be positioned through a respective through hole of through holes 916 of the formed central thermal die pad 906, such that a distal end of each protruding post extends through the respective through hole. The heat slug 908 can be attached to the formed central thermal die pad 906, such that a periphery portion 918 of the heat slug 908 extends beyond a periphery portion 920 of the formed central thermal die pad 906. The chip 912 can be attached to the formed central thermal die pad 906 prior to encapsulation of the leadframe assembly 902 to provide a packaged semiconductor device. By way of example, as shown in FIG. 9, the chip 912 can include a gate driver 922 for driving a GaN field effect transistor (FET) 924 of the chip 912. Because in the example of FIG. 9 the heat slug 908 has a greater surface area than the formed central thermal die pad 904, the heat slug 908 provides an increased heat spreading area for heat produced by the chip 912. Heat produced by the chip 912 can be transferred conductively to the formed central thermal die pad 906, which can transfer the heat to the heat slug 908 for dissipation into an environment.

Figure 10:
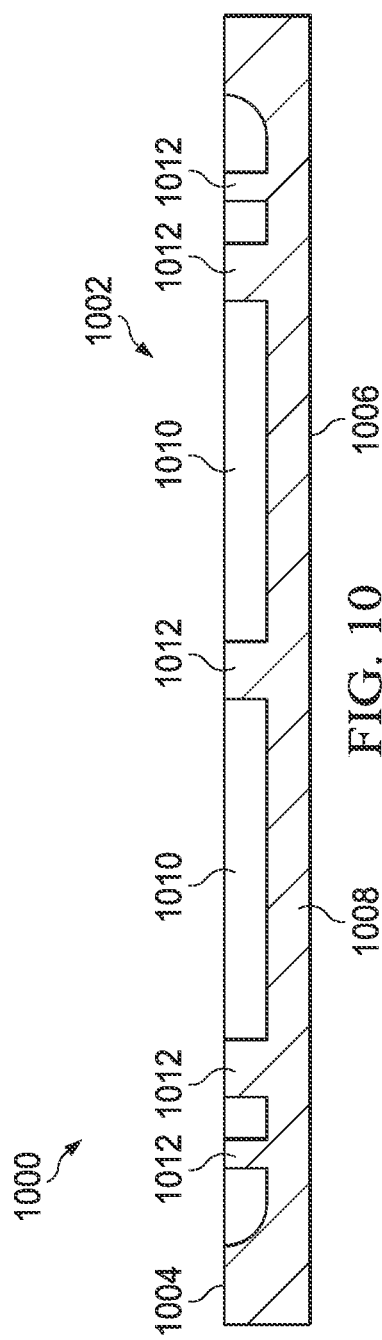
FIG. 10 is an example of a first stage of a process flow for fabricating a metal layer of a semiconductor device.

FIGS. 10-16 show stages of a method for fabricating a semiconductor device, such as the semiconductor device 100, as shown in FIG. 1. Thus, reference can be made to the example of FIG. 1 in the example of FIGS. 10-16. As shown in FIG. 10, at 1000, in a first stage, a half-etched cavity 1002 can be etched on a first side 1004 opposite a second side

1006 of a first metal layer 1008. In some examples, the first metal layer 1008 can be referred to as a heat slug (e.g., the heat slug 112, as shown in FIG. 1). By way of example, one or more masks can be deposited on the first metal layer 1008 and etched to provide the half-etched cavity 1002 and protruding posts 1012 therein. The one or more masks can be stripped away, so as to result in a structure as shown in FIG. 10. The first metal layer 1008 may be a conductive metal, such as Copper. In some examples, the protruding posts 1012 can be formed on the first side 1004 of the first metal layer 1008. In some examples, a first subset of the protruding posts 1012 can have a greater width than a second subset of the protruding posts 1012, as shown in FIG. 10. In other examples, the protruding posts 1012 can have a similar width. The protruding posts 1012 can be located within the half-etched cavity 1002.

Figure 11:
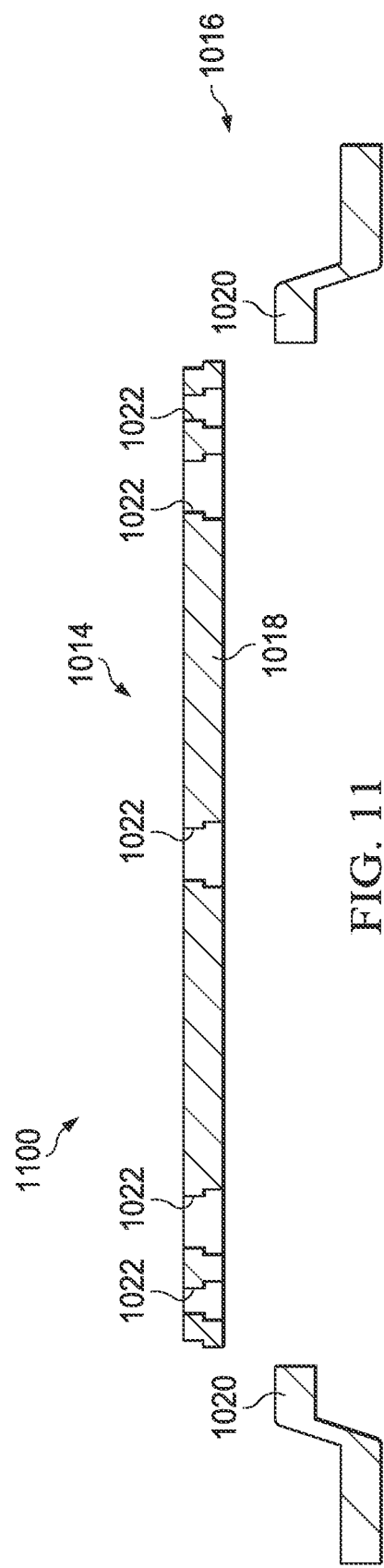
FIG. 11 is an example of a second stage of a process flow for fabricating a leadframe assembly of the semiconductor device.

As shown in FIG. 11, at 1100, in a second stage, a second metal layer 1014 can be patterned to provide a leadframe 1016 that includes a formed central thermal die pad 1018 and conductive terminals 1020. For example, at 1100, in the second stage, the second metal layer 1014 can be etched to include through holes 1022 in the formed central thermal die pad 1018. In some examples, a first subset of the through holes 1022 can have a greater width than a second subset of through holes 1022, as shown in FIG. 11. The first subset of the through holes 1022 can have a width that is greater than the width of the first subset of the protruding posts 1012 and the second subset of the through holes 1022 can have a width that is greater than the width of the second subset of protruding posts 1012, as shown in FIGS. 10-11. In other examples, the first and second subset of through holes 1022 can have a similar width as the first and second subset of the protruding posts 1012. The second metal layer 1014 may be a conductive metal, such as Copper or Copper alloy. In some examples, the first metal layer 1008 can have a greater thickness than the second metal layer 1014. In other examples, the first and second metal layers 1008 and 1014 can have a similar thickness. For example, the leadframe 1016 can be produced, at 1100, in the second stage, by a chemical etching technique or a stamping technique. In other examples, the through holes 1022 can be produced after fabrication of the leadframe 1016. As an example, a mask can be deposited on the formed central thermal die pad 1018 and etched to expose the through holes 1022. The mask thereafter can be stripped away, so as to result in a structure as shown in FIG. 11.

Figure 12:
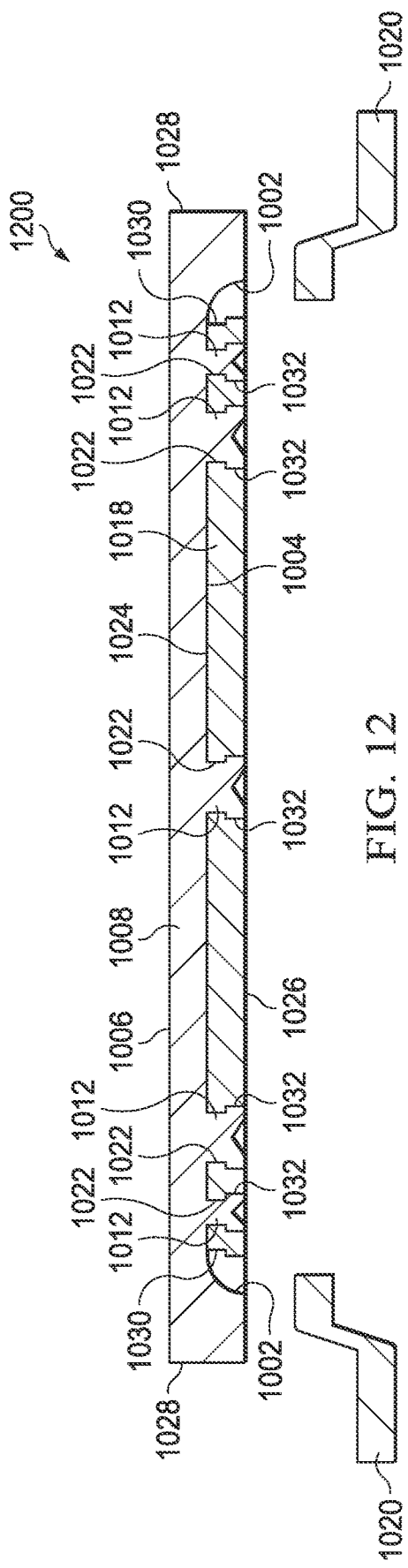
FIG. 12 is an example of a third stage of a process flow for fabricating the semiconductor device that includes attaching the metal layer to the leadframe assembly.

As shown in FIG. 12, at 1200, in a third stage, the first metal layer 1008 can be attached to a first side 1024 opposite a second side 1026 of the formed central thermal die pad 1018, so a periphery portion 1028 of the first metal layer 1008 extends beyond a periphery portion 1030 of the formed central thermal die pad 1018, and at least some of the half-etched cavity 1002 is located near the periphery portion 1030 the formed central thermal die pad 1018. At 1200, in the third stage, the first metal layer 1008 can be attached to the first side 1024 of the formed central thermal die pad 1018, such that the protruding posts 1012 extend into respective through holes 1022 of the formed central thermal die pad 1018. In some examples, at 1200, in the third stage, a riveting process can be used to secure the first metal layer 1008 to the formed central thermal die pad 1018 after positioning each of the protruding posts 1012 through a respective through hole of the through holes 1022. For example, during the riveting process, each of the protruding posts 1012 can be inserted through a respective through hole of the through holes 1022, such that a distal end of each protruding post extends through the respective through hole.

In other examples, at 1200, in the third stage, a laser welding process can be used to secure the first metal layer 1008 to the formed central thermal die pad 1018. For example, during the laser welding process, each of the protruding posts 1012 can be inserted through a respective through hole of the through holes 1022, such that a distal end of each protruding post extends through the respective through hole. During the riving or laser welding process, at 1200, in the third stage, tail ends 1032 of respective protruding posts 1012 can be deformed to secure the first metal layer 1008 to the formed central thermal die pad 1018 to provide a structure, as shown in FIG. 12. In some examples, the structure, as shown in FIG. 12 can be referred to as a leadframe assembly and thus can correspond to the leadframe assembly 300, as shown in FIG. 3.

Figure 13:
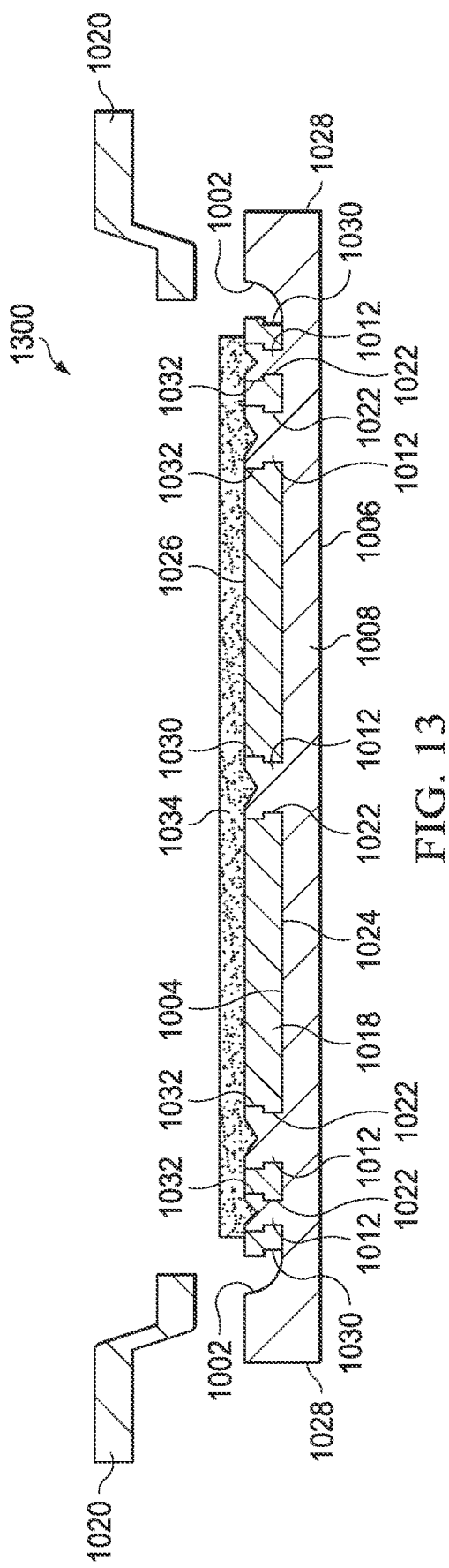
FIG. 13 is an example of a fourth stage of a process flow for fabricating the semiconductor device that includes applying an adhesive material for attaching a chip.
Figure 14:
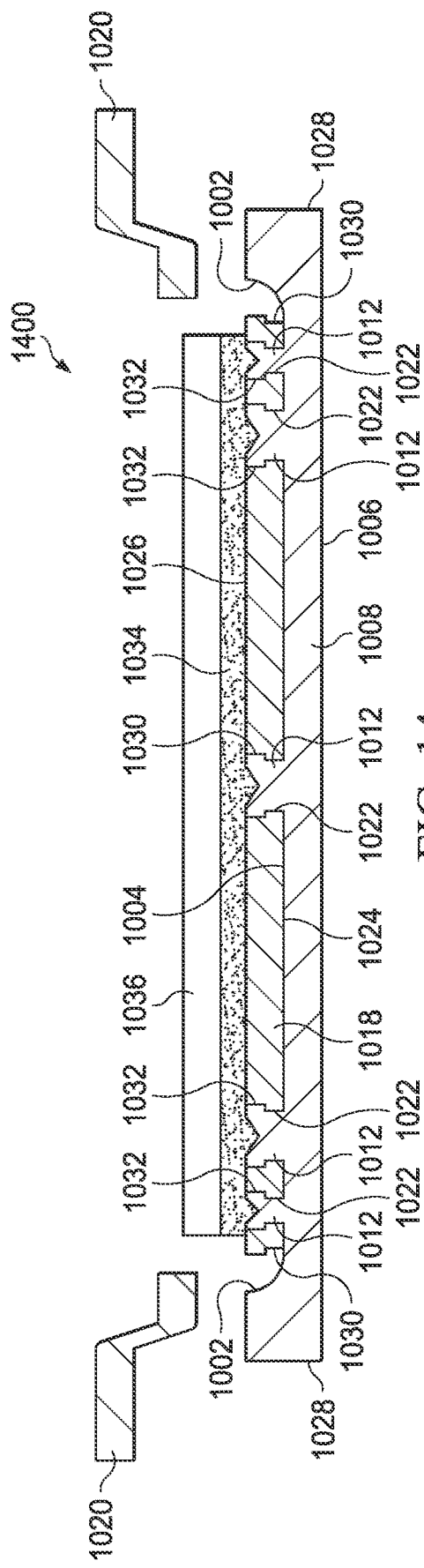
FIG. 14 is an example of a fifth stage of a process flow for fabricating the semiconductor device that includes attaching the chip to the leadframe assembly.
Figure 15:
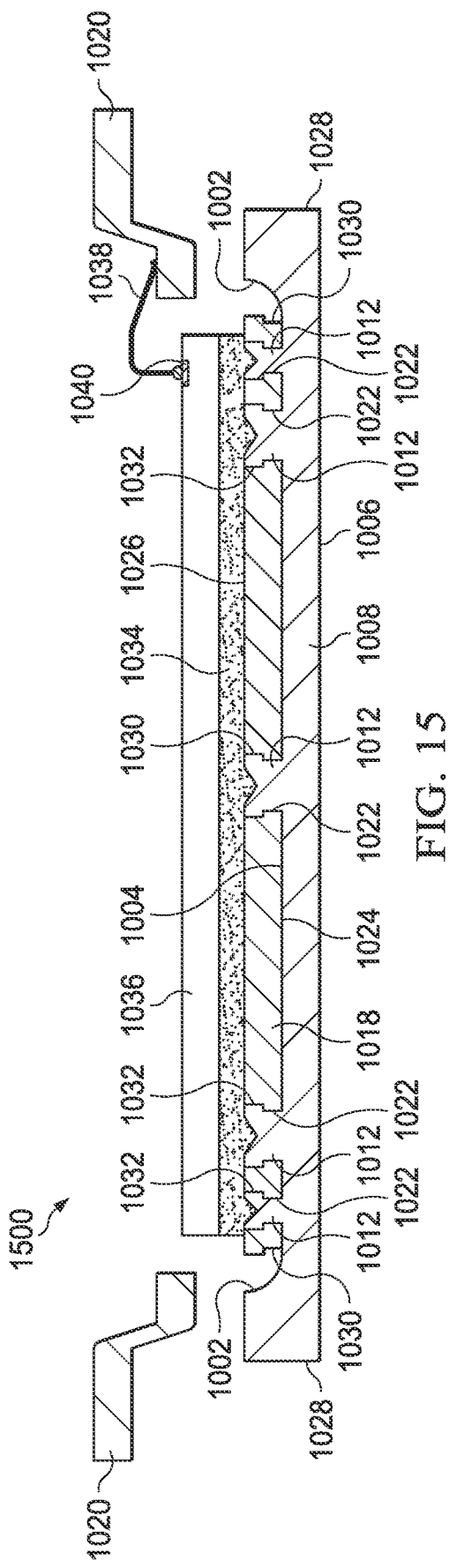
FIG. 15 is an example of a sixth stage of a process flow for fabricating the semiconductor device that includes attaching at least one wire to a chip bonding pad of the chip and a respective conductive terminal of conductive terminals of the leadframe assembly.

As shown in FIG. 13, at 1300, in a fourth stage, a bonding material 1034 can be deposited on the second side 1026 of the formed central thermal die pad 1018. For example, the bonding material 1034 may be a polymeric type of material for attaching a chip 1036. As shown in FIG. 14, at 1400, in a fifth stage, the chip 1036 can be attached to the bonding material 1034 to secure the chip 1036 to the second side 1026 of the formed central thermal die pad 1018. As shown in FIG. 15, at 1500, in a sixth stage, at least one wire 1038 can be used to electrically couple a respective conductive terminal of the conductive terminals 1020 to a respective chip bonding pad 1040 of the chip 1036. For clarity and brevity purposes, the example of FIG. 15 shows a single coupling between the respective conductive terminal of the conductive terminals 1020 and the respective chip bonding pad of the chip 1036. However, it is be understood that any number of wires (e.g., copper wires) may be used to couple a corresponding chip bonding pad of the chip 1036 and a corresponding conductive terminal of the conductive terminals 1020.

Figure 16:
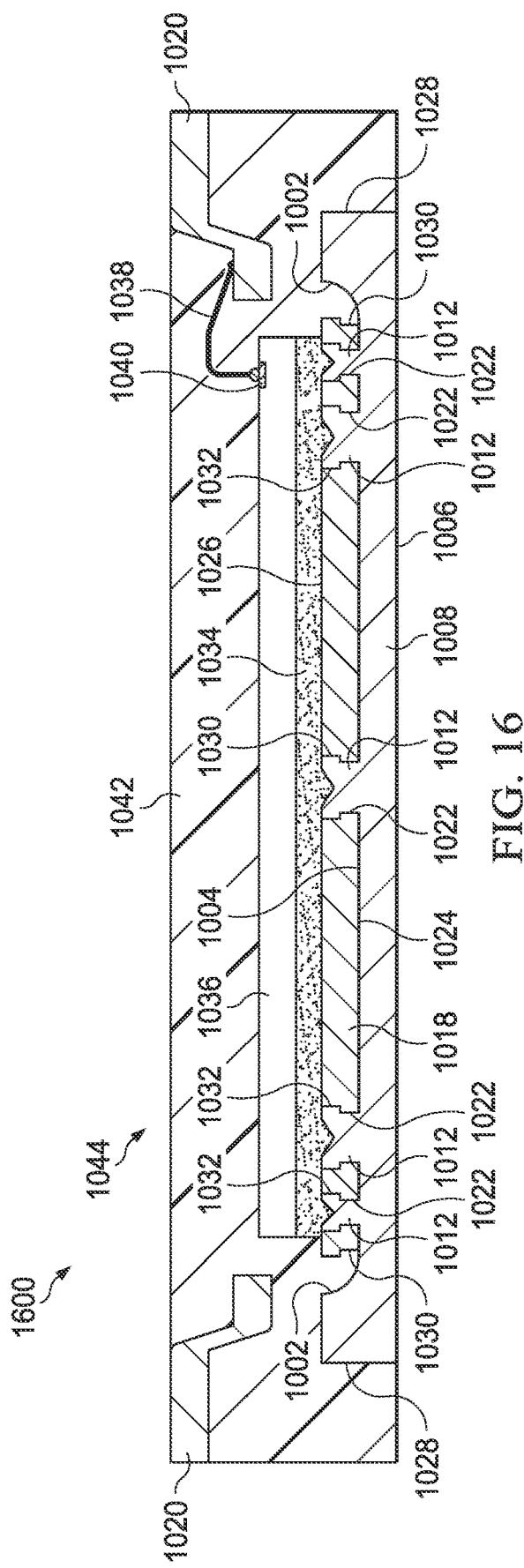
FIG. 16 is an example of a seventh stage of a process flow for fabricating the semiconductor device that including applying a molding compound.

As shown in FIG. 16, at 1600, in a seventh stage, a structure, as shown in FIG. 14, can be encapsulated by a molding compound 1042 to provide a packaged semiconductor device 1044, as shown in FIG. 16. The packaged semiconductor device 1044 can correspond to the semiconductor device 100, as shown in FIG. 1. As an example, the molding compound 1042 can be an epoxy based molding compounding.

Figure 17:
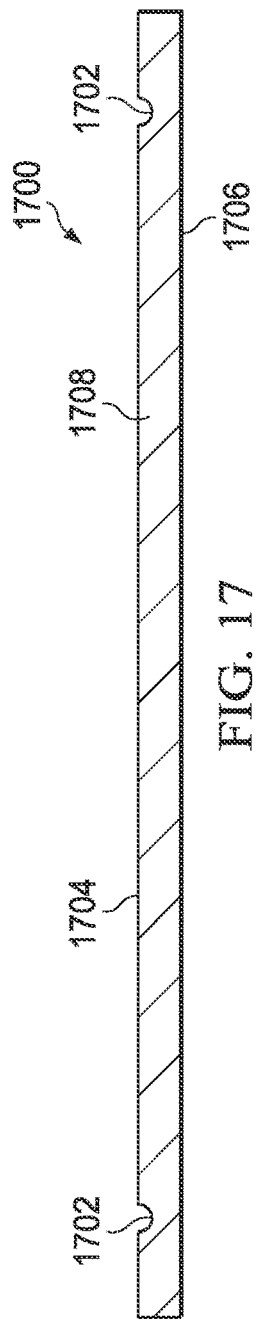
FIG. 17 is an example of a first stage of another process flow for fabricating a metal layer of a semiconductor device.

FIGS. 17-24 show stages of a method for fabricating a semiconductor device, such as the semiconductor device 200, as shown in FIG. 2. Thus, reference can be made to the example of FIGS. 2 and 7 in the example of FIGS. 17-24. As shown in FIG. 17, at 1700, in a first stage, openings 1702 can be formed on a first side 1704 opposite a second side 1706 of a first metal layer 1708. In some examples, the openings 1702 are trench openings. In some examples, the first metal layer 1708 can be referred to as a heat slug (e.g., the heat slug 210, as shown in FIG. 2). The first metal layer 1708 may be a conductive metal, such as Copper. In some examples, the openings 1702 are formed by performing an etch on the first side 1704 of the first metal layer 1708. By way of example, a mask can be deposited on the first side 1704 of the first metal layer 1708 and etched to expose the openings 1702. The mask thereafter can be stripped awayto result in a structure as shown in FIG. 17.

As shown in FIG. 18, at 1800, in a second stage, a second metal layer 1710 can be patterned to provide a leadframe 1712 that includes a formed central thermal die pad 1714 and conductive terminals 1716. The second metal layer 1710 may be a conductive metal, such as Copper or Copper alloy. In some examples, the first metal layer 1708 can have a greater thickness than the second metal layer 1710. In other examples, the first and second metal layers 1708 and 1710 can have a similar thickness. For example, the leadframe 1712 can be produced, at 1800, in the second stage, by a chemical etching technique or a stamping technique. As shown in FIG. 19, at 1900, in a third stage, a bonding material 1718 can be deposited on a first side 1720 opposite a second side 1722 of the formed central thermal die pad 1714. For example, the bonding material 1718 may be a polymeric type of material for attaching the first metal layer 1708. As shown in FIG. 20, at 2000, in a fourth stage, the first metal layer 1708 can be attached to the bonding material 1718 to secure the first metal layer 1708 to the first side 1720 of the formed central thermal die pad 1714. The openings 1702 of the first metal layer 1708 can be used for alignment of the first metal layer 1708 with respect to the formed central thermal die pad 1714, such that the openings 1702 are located near a periphery portion 1724 the formed central thermal die pad 1714.

As shown in FIG. 21, at 2100, in a fifth stage, a bonding material 1726 can be deposited on the second side 1722 of the formed central thermal die pad 1714. For example, the bonding material 1726 may be a polymeric type of material for attaching a chip 1728. As shown in FIG. 22, at 2200, in a sixth stage, the chip 1728 can be attached to the bonding material 1726 to secure the chip 1728 to the second side 1722 of the formed central thermal die pad 1714. As shown in FIG. 23, at 2300, in a seventh stage, at least one wire 1730 can be used to electrically couple a respective conductive terminal of the conductive terminals 1716 to a respective chip bonding pad 1732 of the chip 1728. For clarity and brevity purposes, the example of FIG. 23 shows a single coupling between the respective conductive terminal of the conductive terminals 1716 and the respective chip bonding pad of the chip 1728. However, it is be understood that any number of wires (e.g., copper wires) may be used to couple a corresponding chip bonding pad of the chip 1728 and a corresponding conductive terminal of the conductive terminals 1716.

As shown in FIG. 24, at 2400, in an eighth stage, a structure, as shown in FIG. 24, can be encapsulated by a molding compound 1734 to provide a packaged semiconductor device 1736, as shown in FIG. 24. The packaged semiconductor device 1736 can correspond to the semiconductor device 200, as shown in FIG. 2. As an example, the molding compound 1734 can be an epoxy based molding compounding.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

Modifications are possible in the described embodiments, and other embodiments are possible, within the scope of the claims.

What is claimed is:

1. A method, comprising:
attaching a front side of a metal layer to a die pad of a leadframe comprising conductive terminals, so a periphery portion of the metal layer extends beyond a periphery pad surface of the pad, and a portion of a half-etched cavity on the front side of the metal layer is located near the periphery pad surface of the pad;
attaching a semiconductor device to the pad; and
encapsulating the semiconductor device, the front side of the metal layer, a portion of a back side of the metal layer, and a portion of the conductive terminals to form a packaged semiconductor device.

2. The method of claim 1, wherein the half-etched cavity on the front side of the metal layer comprises protruding posts after cavity etching on the front side of the metal layer, wherein the protruding posts are located within the half-etched cavity.

3. The method of claim 2, the method further comprising patterning a second metal layer according to a pattern to provide the leadframe, wherein the patterning comprises etching through holes in the die pad.

4. The method of claim 3, wherein attaching the front side of the metal layer to the die pad comprises:
inserting each of the protruding posts through a respective through hole of the through holes, such that a distal end of each protruding post extends through the respective through hole; and
pressing the distal end of each protruding post to attach the metal layer to the die pad.

5. The method of claim 3, wherein attaching the front side of the metal layer to the die pad comprises applying a laser welding process to secure the first metal layer to the die pad after positioning each of the protruding posts through a respective through hole of the through holes.

6. The method of claim 5, wherein after the first metal layer is secured to the die pad, the method further comprises electrically coupling the portion of the conductive terminals to respective conductive terminals of the semiconductor device.

7. The method of claim 1, wherein the packaged semiconductor device is a leadless packaged semiconductor device.

8. A method, comprising:
etching grooves on a front side of a metal layer opposite of a back side of the metal layer;
attaching the front side of the metal layer to a die pad of a leadframe comprising conductive terminals, so a periphery portion of the metal layer extends beyond a periphery pad surface of the die pad, and the etched grooves are located near the periphery of the die pad;
attaching a semiconductor device to the formed central thermal die pad; and
encapsulating the semiconductor device, the front side of the metal layer, a portion of the back side of the metal layer, and a portion of the conductive terminals to form a packaged semiconductor device.

9. The method of claim 8, wherein the grooves are half-etched grooves, and the attaching the metal layer to the die pad comprises:
depositing a layer of a bonding material on a surface of the die pad; and
bonding using the bonding material the front side of the metal layer to a surface of the die pad.

10. The method of claim 9, wherein the surface of the die pad is a first surface, and the die pad has a second surface, and the bonding material is a first bonding material, the method further comprising:
depositing a layer of a second bonding material on the second surface of the die pad; and
bonding using the second bonding material the semiconductor device to the second surface of the die pad.

11. The method of claim 10, further comprising electrically coupling the portion of the conductive terminals to the semiconductor device after bonding the semiconductor device to the second surface of the die pad.

12. The method of claim 11, wherein the metal layer is a first metal layer, the method further comprising patterning a second metal layer according to a pattern to provide the leadframe.

13. The method of claim 8, wherein the packaged semiconductor device is a leadless packaged semiconductor device.

14. A semiconductor device comprising:
a leadframe comprising a die pad having a pad surface;
a chip attached to the die pad; and
a metal layer directly connected to the die pad, the metal layer having first and second opposite sides, the metal layer comprising grooves extending into the metal layer from the first opposite side of the metal layer toward, but not touching, the second opposite side of the metal layer, wherein a periphery portion of the metal layer extends beyond a periphery pad surface of the die pad, and the grooves are located near the periphery of the die pad.

15. The semiconductor device of claim 14, wherein the leadframe comprises conductive leads, the semiconductor device further comprising a package layer configured to encapsulate the chip, the first side of the metal layer, and a portion of the conductive leads.

16. The semiconductor device of claim 15, wherein at least some of the portion of the conductive leads are separated from the die pad via a gap and the grooves are partially located within the gap.

17. The semiconductor device of claim 16, wherein the leadframe comprises conductive leads, the semiconductor device further comprising wires coupling respective conductive leads to the chip.

18. The semiconductor package of claim 17, wherein the semiconductor device is one of a Quad Flat No-Lead (QFN) semiconductor device and a Small Outline No-Lead (SON) semiconductor device.

19. A semiconductor device comprising:
a leadframe comprising a die pad, wherein the die pad comprises through holes extending through the die pad;
a chip attached to the die pad; and
a metal layer comprising protruding posts on a front side of the metal layer opposite of a back side of the metal layer, in which the protruding posts extend into respective through holes of the die pad, and a periphery portion of the metal layer extends beyond a periphery pad surface of the die pad.

20. The semiconductor device of claim 19, wherein the leadframe comprises conductive leads, the semiconductor device further comprising a molding compound encapsulating the chip and the front side of the metal layer.

21. A semiconductor device comprising:
a leadframe comprising a die pad and a conductive lead, wherein the die pad comprises through holes extending through the die pad;
a chip attached to the die pad;
a metal layer comprising protruding posts on a front side of the metal layer opposite of a back side of the metal layer, in which the protruding posts extend into respective through holes of the die pad, and a periphery portion of the metal layer extends beyond a periphery pad surface of the die pad, and wherein the metal layer further comprises a half-etched cavity on the front side of the metal layer and a portion of the half-etched cavity is located near a periphery of the die pad; and
a molding compound encapsulating the chip and the front side of the metal layer.

22. The semiconductor device of claim 21, wherein the semiconductor device is one of a Quad Flat No-Lead (QFN) semiconductor device and a Small Outline No-Lead (SON) semiconductor device.

23. The semiconductor device of claim 22, wherein the metal layer is secured to the die pad via one of a riveting process or a welding process opposite of a side to which the chip is attached.

24. The semiconductor package of claim 23, wherein the patterned leadframe comprises conductive leads, the semiconductor device further comprising wires coupling the portion of the leads to the semiconductor device.

25. The semiconductor device of claim 14, wherein rivets attach the metal layer to the die pad.

26. The semiconductor device of claim 14, wherein the metal layer is welded to the die pad.

27. The semiconductor device of claim 14, wherein the metal layer is thicker than the die pad.

28. The semiconductor device of claim 14, wherein the metal layer is the same thickness as the die pad.

29. The semiconductor device of claim 14, further including a molding compound encapsulating the chip and the front side of the metal layer.

30. The semiconductor device of claim 19, wherein distal ends of the protruding posts are deformed to secure the metal layer to the die pad.

31. The semiconductor device of claim 19, wherein the metal layer is welded to the die pad.

32. The semiconductor device of claim 19, wherein the metal layer is thicker than the die pad.

33. The semiconductor device of claim 19, wherein the metal layer is the same thickness as the die pad.

34. The semiconductor device of claim 19, further including a molding compound encapsulating the chip and the front side of the metal layer.

* * * * *